United States Patent [19]

Ghoshal

[11] Patent Number: 4,980,580
[45] Date of Patent: Dec. 25, 1990

[54] CMOS INTERCONNECTION CIRCUIT

[75] Inventor: Uttam S. Ghoshal, Austin, Tex.

[73] Assignee: Microelectronics And Computer Technology Corporation, Austin, Tex.

[21] Appl. No.: 328,656

[22] Filed: Mar. 27, 1989

[51] Int. Cl.$^5$ ............... H03K 17/04; H03K 19/017
[52] U.S. Cl. .................... 307/451; 307/306; 307/446; 307/462; 307/475; 307/476; 307/541; 333/995; 505/865; 505/866
[58] Field of Search ............... 307/443, 446, 448, 451, 307/462, 475, 476, 495, 541, 245, 296.8, 306; 330/264; 333/995; 505/865-866

[56] References Cited

U.S. PATENT DOCUMENTS

| | | | |
|---|---|---|---|
| 3,914,702 | 10/1975 | Gehweiler | 307/451 X |
| 3,953,749 | 4/1976 | Baechtold et al. | 307/462 X |
| 4,414,480 | 11/1983 | Zaslo | 307/443 |
| 4,430,582 | 2/1984 | Bose et al. | 307/475 X |
| 4,459,495 | 7/1984 | Gheewala | 307/541 X |
| 4,518,868 | 5/1985 | Harada et al. | 307/476 X |
| 4,609,836 | 9/1986 | Koike | 307/451 |
| 4,638,185 | 1/1987 | Kobayashi et al. | 307/306 X |
| 4,638,187 | 1/1987 | Boler et al. | 307/451 |
| 4,710,649 | 12/1987 | Lewis | 307/451 |
| 4,719,369 | 1/1988 | Asano et al. | 307/443 |
| 4,727,266 | 2/1988 | Fujii et al. | 307/443 |
| 4,760,292 | 7/1988 | Bach | 307/475 |
| 4,791,321 | 12/1988 | Tanaka et al. | 307/451 |
| 4,837,536 | 6/1989 | Honjo | 307/306 X |

FOREIGN PATENT DOCUMENTS

| | | | |
|---|---|---|---|
| 0051797 | 4/1979 | Japan | 307/541 |
| 0012212 | 1/1987 | Japan | 307/462 |

OTHER PUBLICATIONS

Faris, "Superconducting Sequential Sampler", IBM T.D.B., vol. 26, No. 4, Sep. 1983, pp. 2186-2187.
Halasz et al., "Design and Experimental Technology for 0.1 um Gate Length Low Temperature Operation FET's", IEEE Electron Device Letters, vol. EDL-8, No. 10, Oct. 1987, pp. 463-466.
Raver, "Open-Loop Gain Limitations for Push-Pull Off-Chip Drivers", IEEE Journal of Solid-State Circuits, vol. SC-22, No. 2, Apr. 1987, pp. 145-150.
Shiota et al., "An Observance of Quasi-Particle Tunneling Characteristics in All Y—Ba—Cu—O Film Tunnel Junction", Int. Superconductivity Conf. at Nagoya, Japan, Aug. 1988.
Sun et al., "Submicrometer-Channel CMOS for Low Temperature Operation", IEEE Transactions on Electron Devices, vol. ED-34, No. 1, Jan. 1987, pp. 19-27.
Ghoshal et al., "Skin Effects in Narrow Copper Microstrip at 77K", IEEE Trans. Microwave Theory Tech., vol. MTT-36, No. 12, Dec. 1988, pp. 1788-1795.
Kwon et al., "Superconductors as Very High-Speed System-Level Interconnects", IEEE Electron Device Letters, vol. EDL-8, No. 12, Dec. 1987, pp. 582-585.
Knight et al., "A Self-Terminating Low-Voltage Swing CMOS Output Driver", IEEE Journal of Solid-State Circuits, vol. 23, No. 2, Apr. 1987, pp. 457-464.

Primary Examiner—David Hudspeth
Attorney, Agent, or Firm—Fulbright & Jaworski

[57] ABSTRACT

A low-voltage CMOS interconnection circuit utilizing high-Tc superconducting tunnel junctions and interconnects for a very high speed interchip communication at low temperatures (4–77K). An improved driver produces very small current transients and has good immunity to noise from input voltage fluctuations, cross talk and simultaneous switching of drivers. An improved receiver includes a common gate CMOS receiver having a biasing stage and at least one amplifier stage and has the advantage of a large amplification and is self biasing.

9 Claims, 5 Drawing Sheets

CMOS INTERCONNECTION CIRCUIT

BACKGROUND OF THE INVENTION

Since the discovery of high temperature superconductivity in copper oxides, there has been a lot of activity in modeling the performance of superconducting interconnects and comparing their performance with normal conductors at low temperatures [1–4]. In contrast, this invention is directed to how high-Tc superconducting tunneling junctions (TJs) and interconnects can be employed to realize a low power, high speed CMOS circuit, which reduces the noise due to simultaneous switching of drivers and provides high densitY communication channels. Although power dissipation and current transients in high speed CMOS cascade circuits have been problematic for almost a decade, few alternative schemes [5,6]have been proposed. High-Tc superconducting-insulator-normal metal (SIN) junctions [7]and superconducting-insulator-superconductor (SIS) junctions with no Josephson currents and high Tc TJs with useful gap voltages have been fabricated. It is possible to develop a process for a multilayer superconducting interconnect system which allows TJs to be fabricated at a relatively small increase in manufacturing cost. By comparison with low-Tc superconductors, the small superconductor energy gap voltages should be very stable and reproducible, in comparison to voltage references and clamps generated from semiconductor diodes like the p-n junction or the Schottky diode. A 0.5$\mu$m CMOS technology [8]optimized for 77K operation is assumed for the discussions with this invention.

SUMMARY

One of the features of the present invention is the provision of a common gate CMOS receiver having a biasing stage and an amplifier stage in which the receiver has a large amplification and is self-biasing. The biasing stage includes first and second transistors each having source, gate, and drain nodes. The source node of the first transistor is connected to a first voltage level, and the source node of the second transistor is connected to a second voltage level. The gate nodes of the first and second transistors are connected together and connected to the drain nodes of the first and second transistors providing an output signal. The amplifier stage includes third and fourth transistors, each having source, gate and drain nodes. The gate nodes of the third and fourth transistors are connected together and connected to the output signal. The source nodes of the third transistor is connected to the first voltage source and the source node of the fourth transistor is connected to an input signal. The drain nodes of the third and fourth transistors are connected together and provide an amplified output signal.

Yet a further object of the present invention is the provision of one or more additional amplifier stages connected to the output signal of the biasing stage in which each amplifier stage has a separate input signal and provides a separate amplified output signal.

Another feature of the present invention is the provision of a CMOS driver circuit having first and second transistors each having source, drain and gate nodes. The source node of the first transistor is connected to a first voltage level, and the source node of the second transistor is connected to a second voltage level. The gate nodes of the first and second transistors are connected together for receiving an input signal, and the drain nodes of the first and second transistors are connected together providing an output signal on a common line. Superconductor tunnel junction means are connected in series to the output signal line. The driver circuit dissipates five to eight times less power than conventional designs, produces very small current transients, has good immunity to noise from input voltage fluctuations, cross talk and simultaneous switching of drivers.

Still a further object is wherein the tunnel junction means is connected in parallel with the load impedance connected to the output signal line.

Still a further object of the present invention is the provision of one or more superconductor tunnel junctions connected in series to provide the desired gap voltage.

Yet a still further object of the present invention is wherein the gap voltage of the tunnel junction means divided by the first voltage level less the second voltage level is greater than or equal to 0.0333 to provide the desired noise reduction.

Another feature of the present invention is the provision of a low voltage CMOS interconnection circuit which includes first, second, third and fourth CMOS drivers, each having an input and an output. A first signal is connected to the input of the first driver and an inverse of the first signal is connected to the input of the second driver. A second signal is connected to the input of the fourth driver, and an inverse of the second signal is connected to the input of the third driver. The outputs of the first and third drivers are connected to a first transmission line, and the outputs of the second and fourth drivers are connected to a second transmission line. First superconductor tunnel junction means is connected to the outputs of the first and third drivers, and a second superconductor tunnel junction means is connected to the outputs of the second and fourth drivers. A common gate CMOS receiver having a biasing stage and first and second amplifier stages is connected to the output of the biasing stage. The first of the transmission lines is connected to the input of the first amplifier stage and the second of the transmission lines is connected to the input of the second amplifier stage.

Yet a further object of the present invention is wherein fifth and sixth drivers are provided, each having an input and an output. An inverse of the first signal is connected to the input of the fifth driver, and an inverse of the second signal is connected to the input of the sixth driver, and the outputs of the fifth and sixth drivers are connected to ground through an impedance.

Yet a further object of the present invention is wherein the transmission lines are superconductors.

Other and further objects, features and advantages will be apparent from the following description of a presently preferred embodiment of the invention, given for the purpose of disclosure and taken in conjunction with the accompanying drawings.

Description of the Preferred Embodiments

Figure 1:
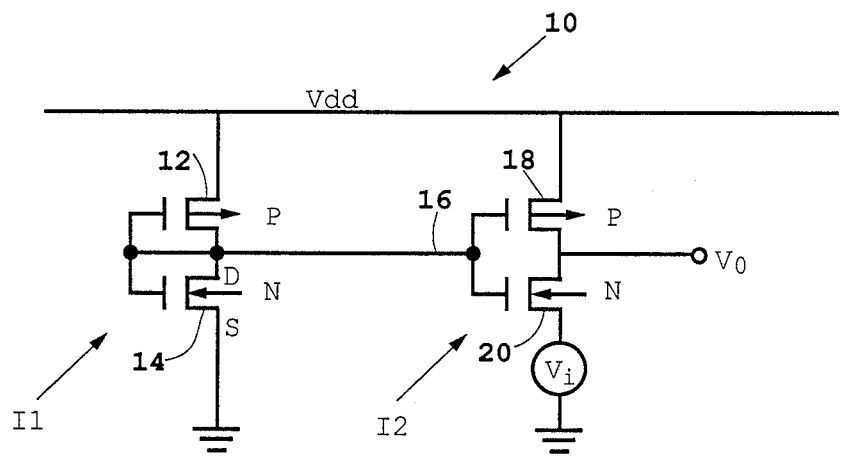
FIG. 1 is a schematic circuit diagram of a receiver of the present invention.
Figure 11:
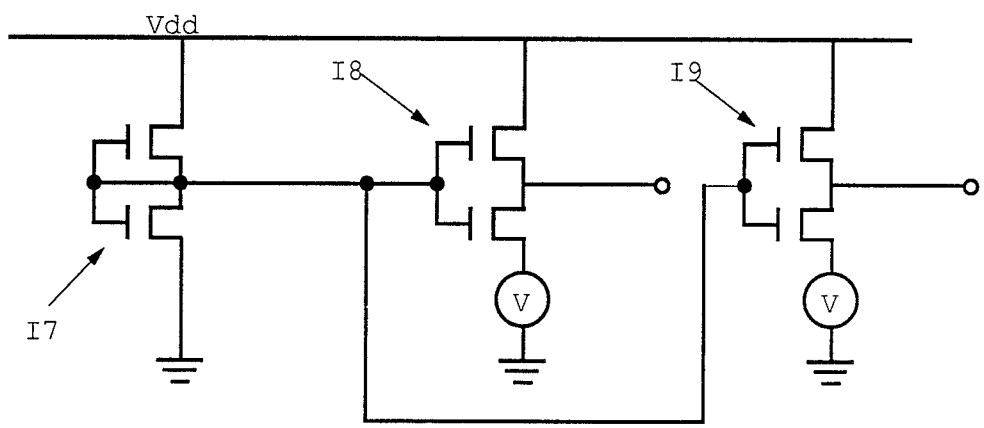
FIG. 11 is a schematic diagram of a two-stage receiver such as shown in FIG. 8.
Figure 2:
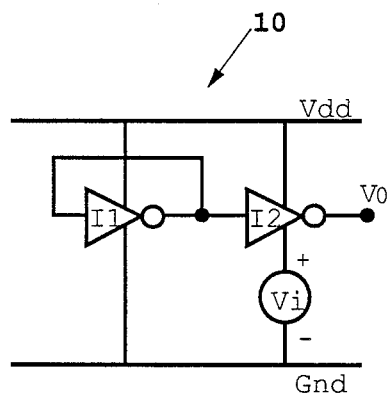
FIG. 2 is a logic diagram of the circuit of FIG. 1.
Figure 3:
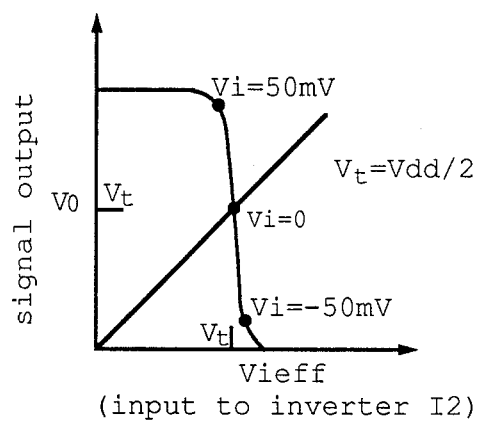
FIG. 3 is a graph of the transfer characteristics of the signal output versus the signal input of the receiver of FIGS. 1 and 2.

Referring now to the drawings and particularly to FIGS. 1 and 2, a common gate CMOS receiver generally indicated by the reference numeral 10 is illustrated which is particularly advantageous for use in the interconnection circuit to be discussed more fully hereinafter. The receiver 10 is a common-gate CMOS amplifier self-biased in the high-gain region. Receiver 10 includes inverters $I_1$ and $I_2$ having the same size ratios and hence have the same voltage transfer characteristics. As best seen in FIG. 3, when the input voltage swings from $-V_i$ to $+V_i$, the output of the inverter $I_2$ swings from low to high CMOS levels. In the example shown, the $V_i$ is approximately 50 mV, as determined by the voltage across a series combination of tunnel junctions biased in the voltage stage as will be more fully discussed hereinafter. The characteristics of the amplifier 10 are independent of the threshold voltage $V_t$ and the supply voltage $V_{dd}$ fluctuations [5].

Referring now to FIG. 1, the biasing stage of the inverter I1 includes a first transistor 12 and a second transistor 14, each having source, gate, and drain nodes. The source node of the first transistor 12 is connected to a first voltage level, such as the supply voltage $V_{dd}$. The source node of the second transistor 14 is connected to a second voltage level, such as ground. The gate nodes of the first and second transistors 12 and 14 are connected together and connected to the drain nodes of the first and second transistors 12 and 14 providing an output signal 16. The amplifier stage of the inverter $I_2$ includes third transistor 18 and fourth transistor 20, each having source, gate and drain nodes. The gate nodes of the third and fourth transistors 18 and 20 are connected together and connected to the output signal 16. The source node of the third transistor 18 is connected to the first voltage level $V_{dd}$ and the drain nodes of the third and fourth transistors 18 and 20 are connected together and provide an amplified output signal $V_o$. The source node of the fourth transistor is connected to an input signal $V_i$.

Figure 4:
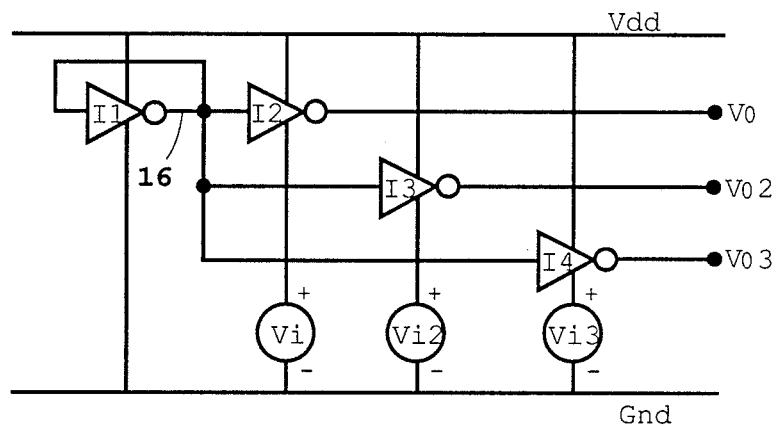
FIG. 4 is a logic diagram illustrating the bias stage of the receiver connected to a plurality of amplifier stages.

If desired, as shown in FIG. 4, the biasing stage $I_1$ can serve as a common bias for several amplifier stages $I_2$, $I_3$, and $I_4$. It is to be noted that the additional amplifier stages are each connected to the output signal 16 of the biasing stage Il but each of the amplifier stages $I_2$, $I_3$, and $I_4$ each has a separate input signal, here $V_i$, $V_{i2}$, and $V_{i3}$, respectively, and provide separate amplified output signals $V_o$, $V_{o2}$, and $V_{o3}$, respectively. The effects of the capacitance coupling between the amplifier stages $I_2$, $I_3$, and $I_4$ can be reduced to a minimum by increasing the capacitance at the output node 16 of the biasing stage $I_1$.

Figure 5:
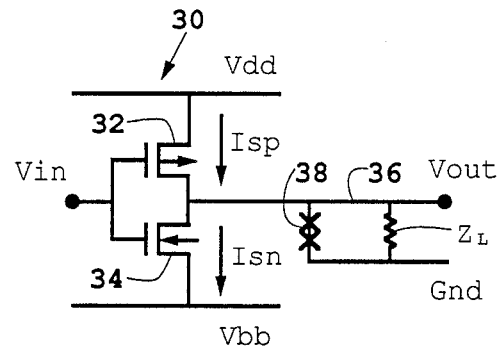
FIG. 5 is a schematic of a CMOS driver circuit with its output clamped by tunnel junction means.

Referring now to FIG. 5, one of the drivers of the present invention is generally indicated by the reference numeral 30 and includes a CMOS inverter-like circuit between two power rails $V_{dd}$ and $V_{bb}$. For the purpose of modeling, the value of $V_{dd}$ has been set a 2 V and $V_{bb}$ at $-1$ V. The driver circuit 30 includes a first transistor 32 and a second transistor 34, each having source, drain and gate nodes. The source node of the first transistor 32 is connected to a first voltage level $V_{dd}$, and the source node of the second transistor 34 is connected to a second voltage level $V_{bb}$. The gate nodes of the first and second transistors 32 and 34 are connected together for receiving an input signal $V_{in}$. The drain nodes of the first and second transistors 32 and 34 are connected together and provide an output signal on a common line 36. The output 36 of the CMOS driver circuit is clamped by superconductor tunnel junction means 38. In the embodiment shown herein, the output node is clamped to $\pm 50$mV by two tunnel junctions connected in series. That is, in the particular example chosen, a tunnel junction was selected in which the gap voltage was equal to 25mV. In the preferred embodiment, such tunnel junction is made of yttrium barium copper oxide ($YBa_2Cu_3O_4$) having a critical temperature Tc of 92° K. In order to provide the desired gap voltage for the present example, two such tunnel junctions are connected in series in the tunnel junction means 38. The load $Z_L$ represents a matched impedance line with characteristic impedance $Z_L$.

Figure 6:
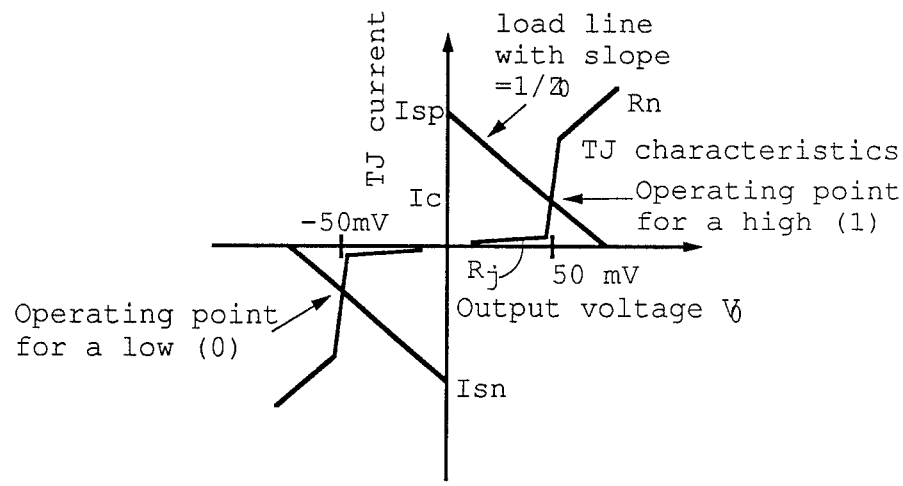
FIG. 6 is a graph showing the transfer characteristics of the tunnel junction means of FIG. 5.

When the $V_{in}$ is high (2V), the p-channel transistor 32 is OFF and the n-channel transistor 34 sinks current and biases the tunnel junction means 38 such that $V_{out}$ equals $-50$mV. The n-channel transistor is biased in saturation and thus acts like a gate-voltage-controlled current sink $I_{sn}$. The load line, as best seen in FIG. 6, is determined only by the load impedance $Z_L$ and the size of the n-channel transistor 34. When $V_{in}$ is low (0 V), the p-channel transistor 32 is ON and a small current leaks through the n-channel transistor 34. The net source current through the p-channel transistor $I_{sp}$ biases the tunnel junction means 38 such that $V_{out}$ equals $+50$mV.

The operating points for high and low digital states are shown on the transfer characteristics in FIG. 6 of two tunnel junctions connected in series. The switching between states is independent of the critical current $I_c$, which may be small and uncontrolled. The load lines are determined by the size of the p- and n-channel transistors 32 and 34, respectively, which act as current source and sink respectively, and the impedance $Z_L$. $R_n$ equals 10 ohms and $R_j$ equals one Kohm represent the resistances of the linear segments shown therein.

The tunnel junction means 38 is connected in parallel with the load impedance $Z_L$ connected to the output signal line. The function of the tunnel junction means 38 is to reduce the noise which would otherwise preclude the use of small signal levels in order to provide the necessary clipping voltage levels, the gap voltage of the tunnel junction means 38 was 50mV in the example given. For a more general value to obtain the desired noise reduction, the following formula is required:

$$\frac{\text{gap voltage of the tunnel junction means}}{\text{first voltage level-second voltage level}} \geq 0.0333$$

Figure 7:
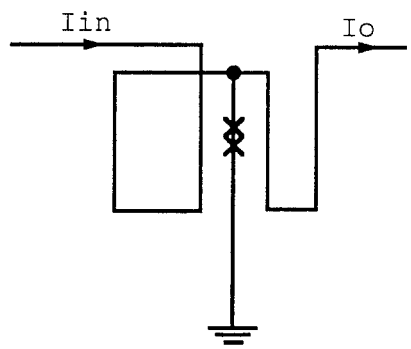
FIG. 7 is a schematic representation of the tunnel junction means of FIG. 5 with the input and output lines acting as control lines.

If the Josephson currents are significant and junction critical currents are slightly different, switching to Josephson junctions concurrently would be a problem since substantial current would be diverted into the load after one of the tunnel junctions switches to the voltage state. In such a case, the output load current may be fed back through a control line that magnetically couples to the junction to achieve a positive feedback and insure proper turn-on as shown schematically in FIG. 7. The dynamic performance of the driver 30 is limited by the intrinsic delay of the CMOS inverter.

Figure 8:
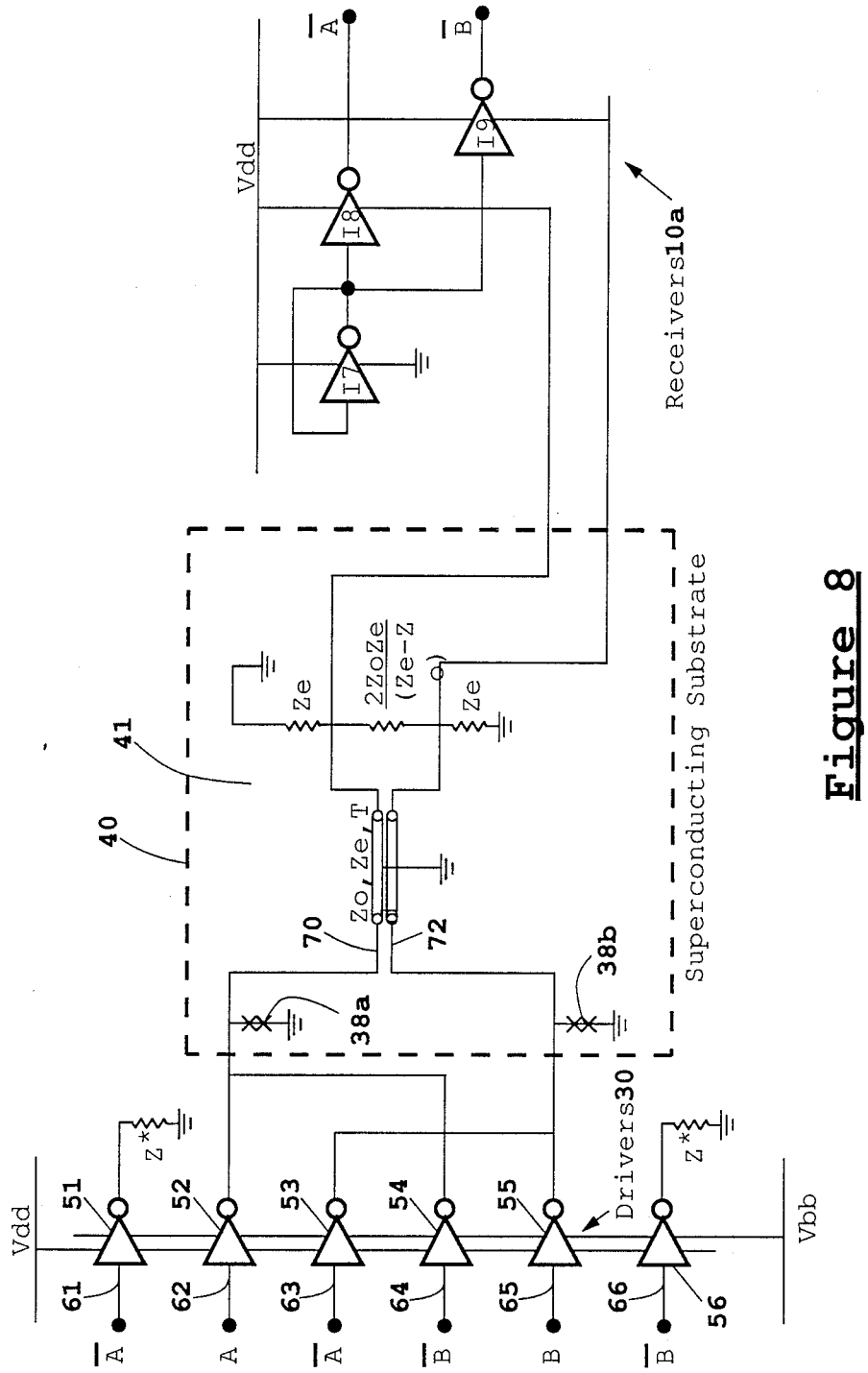
FIG. 8 is a schematic diagram of an interchip connection circuit of the present invention.

Referring now to FIG. 8, the complete interconnection circuit using a receiver 10a, a plurality of drivers 30 and a superconducting interconnect 40 is best seen. The interconnection circuits were simulated using PSPICE [9]and J-SPICE [10]. The tunnel junction means 38 were represented by a piece-wise linear resistor model with the parameters indicated in FIG. 6.

FIG. 8 shows an interchip interconnection circuit showing two closely coupled data paths. The drivers generally indicated by the reference numeral 30 are small and consume little power.

The low-voltage CMOS interconnection circuit of FIG. 8 includes first 52, second 53, third 54, and fourth 55 CMOS drivers, each having an input and an output. A first signal A is connected to the input 62 of the first driver 52. An inverse of the first signal is connected to the input 63 of the second driver 53. A second signal B is connected to the input 65 of the fourth driver 55. An inverse of the second signal is connected to the input 64 of the third driver 54. The outputs of the first 52 and third drivers 54 are connected to a first transmission line 70. The outputs of the second 53 and fourth driver 55 are connected to a second transmission line 72. First superconductor tunnel junction means 38a is connected to the outputs of the first 52 and third 54 drivers. A second superconductor tunnel junction means 38b is connected to the outputs of the second 53 and fourth 55 drivers. A common gate CMOS receiver 10a has a biasing stage $I_7$ and first and second amplifier stages $I_8$ and $I_9$ connected to the output of the biasing stage $I_7$. The first of the transmission lines 70 is connected to the input of the first amplifier stage $I_8$ and the second of the transmission lines 72 is connected to the input of the second amplifier stage $I_9$.

Cross talk voltages in adjacent data paths resulting from transitions in variable A at the inverter driver 52 are suppressed by the inverter driver 53 which is sized approximately $(Z_e-Z_o)/(Z_e+Z_o)$ times the size of inverter 52. Cross talk voltages and adjacent data paths resulting from transitions in variable B at the inverter driver 55 is suppressed by the inverter driver 54 which is sized approximately $(Z_e-Z_o)/(Z_e+Z_o)$ times the size of the inverter driver 55. $Z_o$ is the odd mode impedance, $Z_e$ is the even mode impedance and $T_d$ is the line delay. The coupled transmission lines 70 and 72 are matched at the input to the receiver 10a so that there are no reflections by providing the impedances shown therein.

The transmission lines 70 and 72 and preferably the tunnel junction means 38a and 38b are suitable provided on a superconducting substrate 41. The transmission lines 70 and 72 are superconductors and are preferably of the same materials as the tunnel junctions 38a and 38b as previously described.

In addition, fifth and sixth drivers 51 and 56 are provided, each having an input and an output. An inverse of the first signal A is connected to the input 61 of the fifth driver 51 and an inverse of the second signal B if connected to the input 66 of the driver 56. The outputs of the fifth 51 and sixth 56 drivers are connected to ground through an impedance Z*. Z* is substantially equal to $Z_e$ for balanced drivers.

Figure 9:
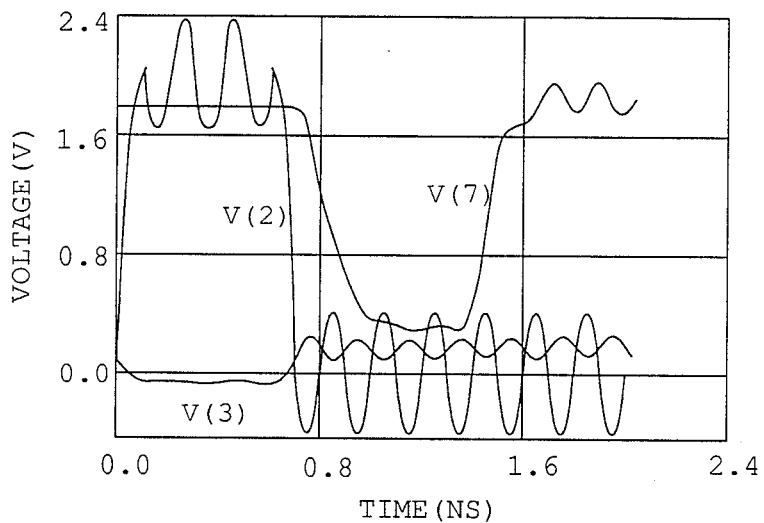
FIG. 9 is a graph illustrating the effects of noise in the circuit of FIG. 8 without tunnel junctions.
Figure 10:
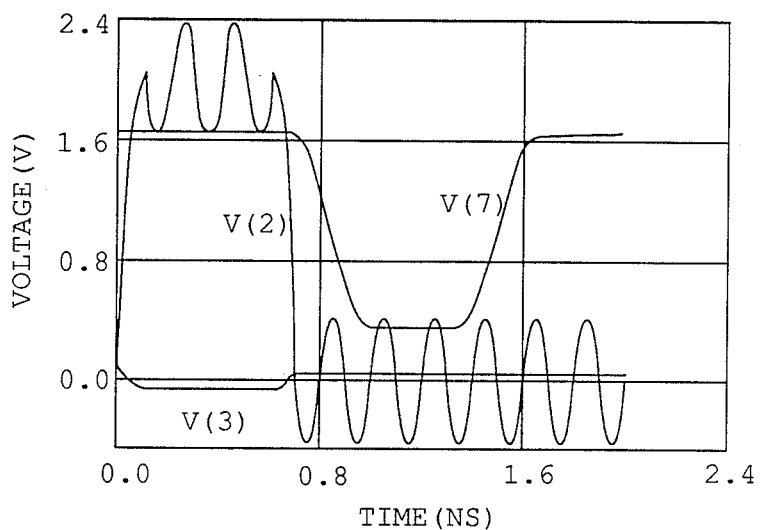
FIG. 10 is a graph similar to FIG. 9 illustrating the effect on the transmission with the use of the tunnel junctions.

The primary function of the tunnel junctions 38a and 38b is to reduce the noise which would otherwise preclude the use of such small signal levels. PSPICE simulations of the interconnection circuit indicated that the relative high and low noise margins through the I/O chain are about 30% and the interconnect system can reject 25mV functions due to noise sources. FIGS. 9 and 10 show the results of PSPICE [9]simulations analyzing effects of input noise rejection by TJs in the circuit described in FIG. 8. The magnitude of the noise injected at the input is 20% of the CMOS signal level and falls within the noise margins of a typical CMOS device. If there were not TJs to clip the low voltage levels (FIG. 9), signals in the transmission lines 70 and 72 would be extremely noisy and signifcant noise would ripple through the common gate amplifier 10a. The magnitude of the worst-case noise in the transmission lines is approximately 150mV and can cause significant cross talk in adjacent lines. When TJs are employed, the signal fidelity is very good and noise ripples are eliminated (FIG. 10). The signal propagation in the load-matched superconducting interconnects can be assumed to be almost dispersionless, and hence with proper terminations and optimization of interconnect geometry, cross talk voltages can be reduced to negligible levels [11]. In comparison to conventional approaches, the relative noise in the power supply due to inductive drops caused by the switching of a single driver is reduced by a factor of ten since the transistor output impedances are approximately 15–20 times the characteristic impedance $Z_L$. In addition, since the p-channel transistors are in saturation, the effects of $V_{dd}$ variation due to simultaneous switching on the output signal currents are greatly reduced.

FIGS. 9 and 10 analyze the necessity of clipping voltage levels. The simulation corresponds to the circuit in FIG. 8 with the following parameters: $V_{dd}=2V$, $V_{bb}=-1$, $Z_\sigma \rightarrow \infty$, $Z_e=50\Omega$, $T_d=666$ ps. The size ($W_p/W_n$) of the inverters 52, $I_7$ and $I_8$ are 12μm/2.5μm, 1.5μm/1μm and 4.5μm/3μm respectively. The capacitances of 1pF and 30fF are assumed at the nodes of $I_7$ and $I_8$ respectively. The node voltage V(2) represents the worse-case input at the inverter 52. V(3) represents the intereconnect voltage at the output of 52 whereas V(7) represents the output of the receiver $I_9$. The voltage waveforms for the case in which no TJs are employed is shown in 9. The noise ripples in the interconnects and the output are very high. When the TJs are used for clipping, the transmission is ripple-free, as shown in FIG. 10.

Similarly, the output of the receiver amplifier $I_9$ is similarly affected.

Thus, high-$T_c$ tunnel junctions and interconnects can be used to realize a high-speed, low power CMOS interconnection circuit. As CMOS channel lengths scale down and still lower operating voltages are quite likely [12], the performance of the above interconnection circuit improves further. The power consumption for a 50 Ω driver employing all types of compensation is approximately 8 mW, which is about five to eight times lower than conventional approaches. Even though the operating voltages are small, the noise performance of this interconnection scheme should be excellent, and can be further improved using extra compensation drivers.

The present invention, therefore, is well adapted to carry out the objects and obtain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

References

[1] U. Ghoshal and L. N. Smith, "Skin effects in narrow copper microstrip at 77K", IEEE Trans. Microwave Theory Tech., vol. MTT36, no. 12, pp. 1788–1795 Dec. 1988.

[2] O. K. Kwon, B. Langley, R. F. Pease and M. R. Beasley, "Superconductors as very high-speed system-level interconnects", IEEE Electron Device Lett., vol. EDL-8, no. 12, pp. 582–585, December 1987.

[3] S. Tewksbury, L. Hornak and M. Hatamian, "Attenuation and phase velocity of high-Tc superconductor transmission lines", to be published in the IEEE Trans. Electron Devices.

[4] C. Hilbert, D. Gibson and D. Herrell, "A comparison of lossy and superconducting interconnect for computers", submitted for publication in IEEE Trans. Electron Devices.

[5] T. F. Knight and A. Krymm, "A self-terminating low-voltage swing CMOS output driver", IEEE J. Solid-State Circuits, vol. 23, no. 2, pp. 457–464, April 1988.

[6] N. Raver, "Open-loop gain limitations for push-pull off-chip drivers", IEEE J. Solid-State Circuits, vol. SC-22, no. 2, pp. 145–150, April 1987.

[7] T. Shiota, K. Takechi, Y. Jakai and H. Hayakawa, "An observation of quasi-particle tunneling characteristics in all Y-Ba-Cu-O thin film tunnel junction", preprint of the paper presented at Int. Superconductivity Conf., Nagoya, Japan, August 1988.

[8] J. Y.-C. Sun, Y. Taur, R. H. Dennard and S. P. Klepner, "Submicrometer-channel CMOS for low-temperature operation", IEEE Trans. Electron Devices, vol. ED-34, no. 1, pp. 19–27, January 1987.

[9] PSPICE version 3.8: A commercial version of SPICE, a circuit simulator developed at University of California, Berkeley, released by MicroSim Corporation, 1988.

[10] J-SPICE: A version of SPICE, which includes models of Josephson Junctions, developed by R. E. Jewett at the University of California, Berkeley, 1982.

[11] U. Ghoshal, "Cross talk in miniature normal-state and superconducting microstrips at 77K" to be published at Device Research Conference, MIT, June 1989.

[12] G. Sai-Halasz, M. Wordeman, D. Kern, E. Ganin, S. Rishton, D. Zicherman, H. Schmid, M. Polcari, H. Ng, P. Restle, T. Chang and R. Dennard, "Design and experimental technology for 0.1μm gate-length low-temperature operation FETs", IEEE Electron Device Lett., vol. EDL-8, no. 10, pp. 463–466 October 1987.

What is claimed is:

1. A common gate CMOS receiver comprising,
  a biasing stage including first and second transistors each having source, gate, and drain nodes,
  the source node of the first transistor being connected to a first voltage level,
  the source node of the second transistor being connected to a second voltge level,
  the gate nodes of the first and second transistors connected together and connected to the drain nodes of the first and second transistors providing an output signal,
  an amplifier stage including third and fourth transistors each having source, gate and drain nodes,
  the gate nodes of the third and fourth transistors connected together and connected to the output signal,
  the source node of the third transistor connected to said first voltage level,
  the source node of the fourth transistor being connected to an input signal,
  the drain nodes of the third and fourth transistors connected together and providing a separate amplified output signal.

2. The circuit of claim 1 including,
  an additional amplifier stage connected to the output signal of the biasing stage, having a separate input signal and providing a separate amplified output signal.

3. A CMOS driver circuit comprising,
  first and second transistors each having source, drain and gate nodes,
  the source node of the first transistor being connected to a first voltage level,
  the source node of the second transistor being connected to a second voltage level,
  the gate nodes of the first and second transistors being connected together for receiving an input signal,
  the drain nodes of the first and second transistors connected together providing an output signal on a common line, and
  superconductor tunnel junctions means connected to the output signal line.

4. The circuit of claim 3 wherein the tunnel junction is connected in parallel with the load impedance connected to the output signal line.

5. The circuit of claim 3 wherein, $$\frac{\text{gap voltage of the tunnel junction means}}{\text{first voltage level-second voltage level}} \geq 0.0333$$

6. A low voltage CMOS interconnection circuit comprising,
  first, second, third and fourth CMOS drivers, each having an input and an output,
  a first signal connected to the input of the first driver,
  an inverse of the first signal connected to the input of the second driver,
  a second signal connected to the input of the fourth driver,
  an inverse of the second signal connected to the input of the third driver,
  the outputs of the first and third drivers connected to a first transmission line,
  the outputs of the second and fourth drivers connected to a second transmission line,
  first superconductor tunnel junction means connected to the outputs of the first and third drivers, a second superconductor tunnel junction means connected to the outputs of the second and fourth drivers, a common gate CMOS receiver having a biasing stage and first and second amplifier stages connected to the output of the biasing stage, the first of the transmission lines connected to the input of the first amplifier stage, and the second of the transmission lines connected to the input of the second amplifier stage.

7. The circuit of claim 6 including, fifth and sixth drivers, each having an input and an output, an inverse of the first signal connected to the input of the fifth driver, an inverse of the second signal connected to the input of the sixth driver, the outputs of the fifth and sixth drivers connected to ground through an impedance.

8. The circuit of claim 6 wherein the transmission lines are superconductors.

9. The circuit of claim 6 wherein the common gate CMOS receiver includes, a biasing stage including first and second transistors each having source, gate, and drain nodes, the source node of the first transistor being connected to a first voltage level, the source node of the second transistor being connected to a second voltage level, the gate nodes of the first and second transistors connected together and connected to the drain nodes of the first and second transistors providing an output signal, a first amplifier stage including third and fourth transistors each having source, gate and drain nodes, the gate nodes of the third and fourth transistors connected together and connected to the output signal, the source node of the third transistor connected to said first voltage level, the source node of the fourth transistor being connected to the first of the transmission lines, the drain nodes of the third and fourth transistors connected together and providing a first amplified output signal, a second amplifier stage including fifth and sixth transistors each having source, gate and drain nodes, the gate nodes of the fifth and sixth transistors connected together and connected to the output signal, the source node of the fifth transistor connected to said first voltage level, the source node of the sixth transistor being connected to the second of the transmission lines, and the drain nodes of the fifth and sixth transistors connected together and providing a second amplified output signal.

* * * * *

UNITED STATES PATENT AND TRADEMARK OFFICE
CERTIFICATE OF CORRECTION

PATENT NO. : 4,980,580
DATED : December 25, 1990
INVENTOR(S) : Uttam S. Ghoshal

It is certified that error appears in the above-identified patent and that said Letters Patent is hereby corrected as shown below:

Column 1, line 10, delete "densitY" and replace it with -- density --

Column 3, line 29, delete "I2" and replace it with -- $I_2$ --

Column 3, line 38, delete "I1" and replace it with -- $I_1$ --

Column 3, line 63, delete "I1" and replace it with -- $I_1$ --

Column 4, line 8, delete "a" and replace it with -- at --

Column 6, line 19, delete "signifcant" and replace it with -- significant --

Column 6, line 49, delete "intereconnect" and replace it with -- interconnect --

Column 7, line 17, after "MTT" insert -- - --; and after "1795" insert -- , --

Column 7, line 39, delete "Jakai" and replace it with -- Takai --

Column 7, line 65, after "466" insert -- , --

UNITED STATES PATENT AND TRADEMARK OFFICE
CERTIFICATE OF CORRECTION

PATENT NO. : 4,980,580

DATED : December 25, 1990

INVENTOR(S) : Uttam S. Ghoshal

It is certified that error appears in the above-identified patent and that said Letters Patent is hereby corrected as shown below:

Column 8, line 6, delete "voltge" and replace it with -- voltage --

Signed and Sealed this

Twenty-third Day of November, 1993

Attest:

BRUCE LEHMAN

Attesting Officer

Commissioner of Patents and Trademarks